US012596299B2

(12) United States Patent
Kashiwaya et al.

(10) Patent No.: US 12,596,299 B2
(45) Date of Patent: Apr. 7, 2026

(54) EUV TRANSMISSIVE MEMBRANE

(71) Applicant: NGK INSULATORS, LTD., Nagoya (JP)

(72) Inventors: Toshikatsu Kashiwaya, Inazawa (JP); Naoki Goriki, Kasugai (JP); Shoji Tange, Kasugai (JP); Atsuo Kondo, Okazaki (JP)

(73) Assignee: NGK INSULATORS, LTD., Nagoya (JP)

( * ) Notice: Subject to any disclaimer, the term of this patent is extended or adjusted under 35 U.S.C. 154(b) by 506 days.

(21) Appl. No.: 18/180,311

(22) Filed: Mar. 8, 2023

(65) Prior Publication Data

US 2024/0094628 A1     Mar. 21, 2024

Related U.S. Application Data

(63) Continuation of application No. PCT/JP2022/034591, filed on Sep. 15, 2022.

(51) Int. Cl.
G03F 1/64 (2012.01)

(52) U.S. Cl.
CPC ..................................... G03F 1/64 (2013.01)

(58) Field of Classification Search
CPC ..... G03F 1/22; G03F 1/62; G03F 1/64; G02B 1/14
See application file for complete search history.

(56) References Cited

U.S. PATENT DOCUMENTS

| 10,228,615 B2 | 3/2019 | Nikipelov et al. |
| 10,712,659 B2 | 7/2020 | Gallagher et al. |

| 2018/0134561 A1 | 5/2018 | Yanase |
| 2018/0259845 A1 | 9/2018 | Nam et al. |
| 2019/0324365 A1 | 10/2019 | De Groot et al. |
| 2023/0213848 A1* | 7/2023 | Kashiwaya ............... G03F 1/62 |
| | | 430/5 |

FOREIGN PATENT DOCUMENTS

| JP | 2017-083791 A | 5/2017 |
| JP | 2018-077412 A | 5/2018 |
| JP | 2018-151622 A | 9/2018 |
| JP | 2018-194840 A | 12/2018 |
| JP | 2018-537720 A | 12/2018 |
| JP | 6858817 B2 | 4/2021 |
| KR | 10-2021-0070575 A | 6/2021 |
| WO | 2017/102380 A1 | 6/2017 |
| WO | 2021/037662 A1 | 3/2021 |

OTHER PUBLICATIONS

English translation of the Written Opinion dated May 12, 2023 (Application No. PCT/JP2022/034591).
International Search Report and Written Opinion (Application No. PCT/JP2022/034591) dated Nov. 1, 2022.

* cited by examiner

*Primary Examiner* — Stewart A Fraser
(74) *Attorney, Agent, or Firm* — BURR PATENT LAW, PLLC

(57) ABSTRACT

There is provided an EUV transmissive membrane including: a main layer composed of metallic beryllium that has a first surface and a second surface; and a pair of surface layers provided on the first surface and the second surface of the main layer, each containing at least one fluoride selected from beryllium fluoride, beryllium fluoride nitride, beryllium fluoride oxide, and beryllium fluoride nitride oxide.

13 Claims, 3 Drawing Sheets

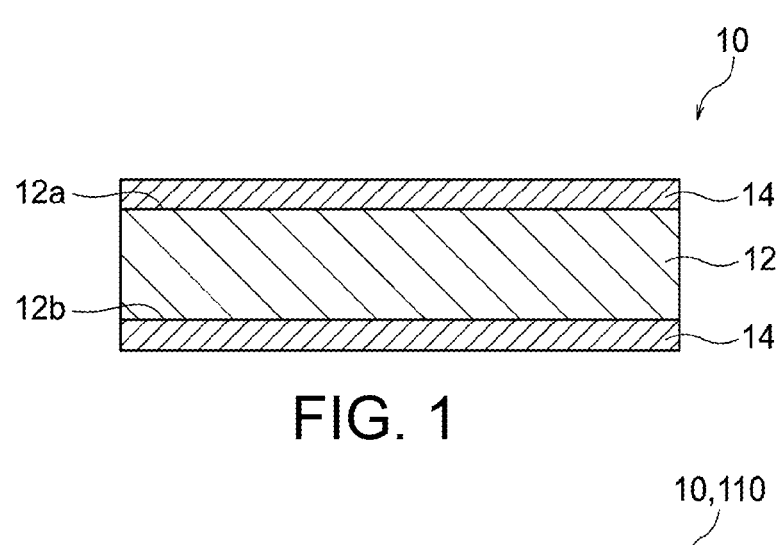
FIG. 1
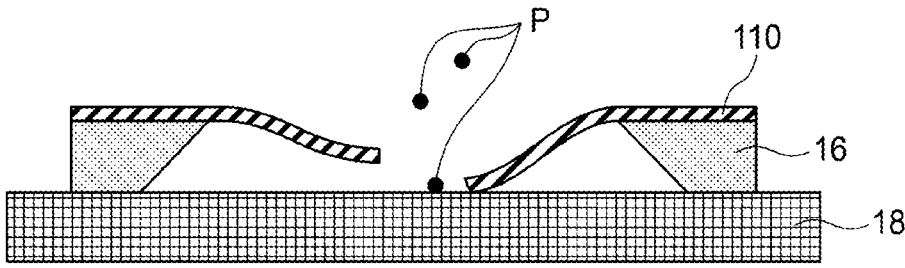
FIG. 2A
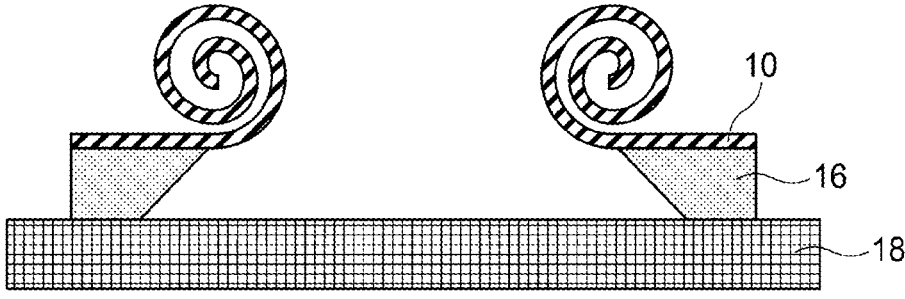
FIG. 2B
FIG. 2C

EUV TRANSMISSIVE MEMBRANE

CROSS-REFERENCE TO RELATED APPLICATION

This application is a continuation application of PCT/JP2022/034591 filed Sep. 15, 2022, the entire contents all of which are incorporated herein by reference.

BACKGROUND OF THE INVENTION

1. Field of the Invention

The present invention relates to an EUV transmissive membrane.

2. Description of the Related Art

Miniaturization in semiconductor manufacturing technology is advancing year by year. Technologies for advancing miniaturization have been improved in many processes in semiconductor manufacturing. Among them, extreme ultraviolet (EUV) light having a wavelength of 13.5 nm has begun to be used in the exposure process in place of conventional ArF exposure having a wavelength of 193 nm. The wavelength is reduced to 1/10 or less by changing from ArF light to EUV light, and the optical properties of EUV light are completely different from those of ArF light. Therefore, a lot of new technological developments are required. In particular, development of a pellicle having a high EUV transmittance as a pellicle which serves as a particle adhesion-preventing membrane of, for example, a photomask (reticle) has been awaited. Currently, there is no pellicle having a high transmittance for EUV light, and in a case where existing pellicle is used, there are problems such that the EUV light intensity greatly decreases when EUV light passes through the pellicle, and the throughput decreases due to a longer exposure time, or the pellicle absorbs the EUV light and becomes hot and degrades in a short time.

Therefore, a pellicle membrane has been developed. For example, Patent Literature 1 (JP6858817B) discloses a pellicle membrane including a core layer that contains a material substantially transparent for EUV radiation such as (poly-)Si and a cap layer that contains a material absorbing IR radiation. However, the poly-Si based pellicle membrane is not yet practical because the EUV transmittance cannot reach the target value of 90% in a case where the thickness is set to maintain the membrane strength. A carbon nanotube (CNT)-based pellicle membrane has also been developed (Patent Literature 2 (JP2018-194840A)), which is expected to have higher EUV transmittance.

Although the pellicle membrane may be damaged during use, it is also required to take measures so as not to affect pattern transfer even in such a case. For example, Patent Literature 3 (JP2018-537720A) discloses a pellicle membrane including a breakage region which is configured to preferentially break during normal use in a lithographic apparatus, whereby a position on the pellicle membrane which breaks first is determined in advance. This literature also discloses a method of detecting breakage of a pellicle membrane, a method of preventing breakage from developing in the case of detecting the breakage, and a method of causing a pellicle membrane to roll up due to difference in tension in the thickness direction of the pellicle membrane when the pellicle membrane is damaged.

CITATION LIST

Patent Literature

Patent Literature 1: JP6858817B
Patent Literature 2: JP2018-194840A
Patent Literature 3: JP2018-537720A

SUMMARY OF THE INVENTION

For example, the CNT-based pellicle membrane, however, does not have durability against a pellicle use environment (low-pressure hydrogen atmosphere). When the pellicle membrane is coated with metal to provide durability, the EUV transmittance decreases, making it impossible to achieve a practical level of transmittance. For this reason, device manufacturers have no choice but to make their products by EUV exposure without using a pellicle membrane. In particular, since Patent Literature 3 does not disclose any specific material, thickness, stress, and other characteristics of the pellicle membrane, the state of the pellicle membrane at the time of breakage varies depending on the properties of the pellicle membrane to be used. Therefore, it is desired to appropriately control the properties of the pellicle membrane to be used so as not to affect pattern transfer even when the pellicle membrane is damaged. Thus, there are various performances required for a pellicle membrane, such as high EUV transmittance, in-plane uniformity of EUV transmittance, and durability in a low-pressure hydrogen atmospheric environment. In particular, it is especially desirable that the pellicle membrane does not generate particles even when damaged. In case the pellicle membrane is damaged and particles are generated, the particles adhere to a reticle, mirror, or other object to cause a pattern transfer error. If particles adhere to the reticle, the photomask needs to be cleaned, and if particles adhere to the inside of an exposure system, the exposure system needs to be cleaned. When the exposure system is cleaned, the device manufacturer suffers significant damage, such as long-term system stoppage and high costs. Therefore, there is a demand for an EUV transmissive membrane as a pellicle membrane that is less likely to generate particles even when damaged.

The present inventors have recently found that by combining a main layer composed of metallic beryllium and a pair of surface layers containing fluoride, it is possible to provide an EUV transmissive membrane that is less likely to generate particles in case the membrane is damaged by any possibility.

Accordingly, an object of the present invention is to provide an EUV transmissive membrane that is less likely to generate particles in case the membrane is damaged by any possibility.

The present invention provides the following aspects:

[Aspect 1]

An EUV transmissive membrane comprising:
 a main layer composed of metallic beryllium that has a first surface and a second surface; and
 a pair of surface layers provided on the first surface and the second surface of the main layer, each comprising at least one fluoride selected from beryllium fluoride, beryllium fluoride nitride, beryllium fluoride oxide, and beryllium fluoride nitride oxide.

[Aspect 2]

The EUV transmissive membrane according to Aspect 1, wherein the surface layer comprises beryllium fluoride.

[Aspect 3]

The EUV transmissive membrane according to Aspect 1 or 2, wherein the surface layer comprises beryllium fluoride nitride.

[Aspect 4]

The EUV transmissive membrane according to Aspects 1 to 3, wherein the surface layer comprises beryllium fluoride oxide.

[Aspect 5]

The EUV transmissive membrane according to Aspects 1 to 4, wherein the surface layer comprises beryllium fluoride nitride oxide.

[Aspect 6]

The EUV transmissive membrane according to Aspects 1 to 5, wherein the surface layer further comprises at least one selected from the group consisting of beryllium nitride, beryllium nitride oxide, and beryllium oxide.

[Aspect 7]

The EUV transmissive membrane according to Aspect 6, wherein the surface layer comprises beryllium fluoride and beryllium nitride.

[Aspect 8]

The EUV transmissive membrane according to Aspect 6 or 7, wherein the surface layer comprises beryllium fluoride and beryllium nitride oxide.

[Aspect 9]

The EUV transmissive membrane according to Aspects 6 to 8, wherein the surface layer comprises beryllium fluoride and beryllium oxide.

[Aspect 10]

The EUV transmissive membrane according to Aspects 6 to 9, wherein the surface layer comprises beryllium fluoride, beryllium oxide, and beryllium nitride.

[Aspect 11]

The EUV transmissive membrane according to any one of Aspects 1 to 10, wherein a thickness of the surface layer on the first surface is 1.1 times or more of a thickness of the surface layer on the second surface.

[Aspect 12]

The EUV transmissive membrane according to any one of Aspects 1 to 11, wherein a fluorine atom concentration at an outermost surface of the surface layer on the first surface is 1.5 times or more of a fluorine atom concentration at an outermost surface of the surface layer on the second surface.

[Aspect 13]

The EUV transmissive membrane according to any one of Aspects 1 to 12, wherein a thickness of the surface layer on the first surface is greater than a thickness of the surface layer on the second surface, and a fluorine atom concentration at an outermost surface of the surface layer on the first surface is higher than a fluorine atom concentration at an outermost surface of the surface layer on the second surface, wherein a ratio of the thickness of the surface layer on the first surface to the thickness of the surface layer on the second surface, denoted by A, and a ratio of the fluorine atom concentration at the outermost surface of the surface layer on the first surface to the fluorine atom concentration at the outermost surface of the surface layer on the second surface, denoted by B, satisfy $A \times B \geq 2.0$.

BRIEF DESCRIPTION OF THE DRAWINGS

FIG. 1 is a schematic cross-sectional view illustrating an embodiment of an EUV transmissive membrane according to the present invention.

FIG. 2A is a schematic cross-sectional view illustrating a state of an EUV transmissive membrane before breakage.

FIG. 2B is a schematic cross-sectional view illustrating a state of a conventional EUV transmissive membrane after breakage.

FIG. 2C is a schematic cross-sectional view illustrating a state of an EUV transmissive membrane of the present invention after breakage.

DETAILED DESCRIPTION OF THE INVENTION

EUV Transmissive Membrane

Figure 3A:
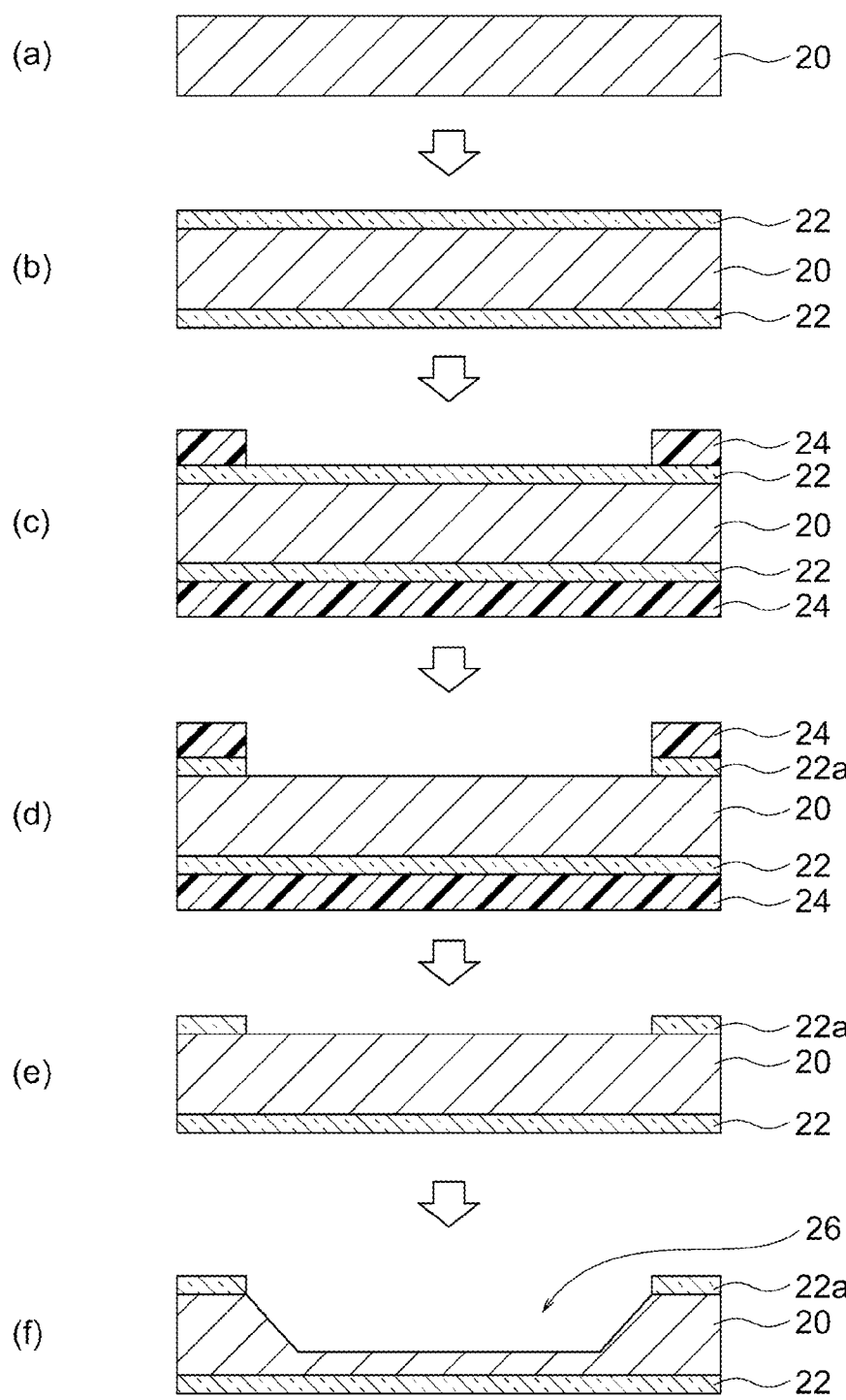
FIG. 3A is a process flow diagram illustrating the first half of a manufacturing procedure for an EUV transmissive membrane in Example 2.

FIG. 1 illustrates a schematic cross-sectional view of an EUV transmissive membrane 10 according to an embodiment of the present invention. The EUV transmissive membrane 10 includes a main layer 12 and a pair of surface layers 14 provided on both sides of the main layer 12. In other words, the main layer 12 has a first surface 12a and a second surface 12b, and the surface layer 14 is provided on each of the first surface 12a and the second surface 12b. The main layer 12 is composed of metallic beryllium, while the surface layer 14 contains at least one fluoride selected from beryllium fluoride, beryllium fluoride nitride, beryllium fluoride oxide, and beryllium fluoride nitride oxide. In particular, a preferred aspect of the surface layer 14 is to contain a lot of fluoride on the outermost surface. In this way, by combining the main layer 12 composed of metallic beryllium and a pair of the surface layers 14 containing fluoride, it is possible to provide the EUV transmissive membrane 10 that is less likely to generate particles, in case the membrane is damaged by any possibility.

In other words, there are various performances required for a pellicle membrane, such as high EUV transmittance and durability in a low-pressure hydrogen atmospheric environment. In particular, it is especially desirable that the pellicle membrane does not generate particles even when damaged. In case the pellicle membrane is damaged by any possibility and particles are generated, the particles adhere to a reticle, mirror, or other object to cause a pattern transfer error. If particles adhere to the reticle, the photomask needs to be cleaned, and if particles adhere to the inside of an exposure system, the exposure system needs to be cleaned. When the exposure system is cleaned, the device manufacturer suffers significant damage, such as long-term system stoppage and high costs. All these problems are successfully solved by the EUV transmissive membrane 10 of the present invention. The mechanism of particle generation at the time of breakage of the pellicle membrane will be described in detail as follows. First, the size of the EUV transmissive membrane is typically about 110×140 mm. In this case, since the gap between the reticle and the EUV transmissive membrane is only 2 to 3 mm, depending on the state of the EUV transmissive membrane after breakage, the EUV transmissive membrane may generate particles from the damaged portion of the EUV transmissive membrane by coming into contact with the reticle, and the particles may unfortunately adhere to the reticle. After a laminated membrane to be the EUV transmissive membrane 10 is formed on a substrate (e.g., a Si substrate) used at the time of deposition, for example, a free-standing membrane as the EUV transmissive membrane 10 of the present invention (or the conventional EUV transmissive membrane 110) can be typically fabricated by removing an unnecessary portion of the Si substrate through etching with $XeF_2$ to form the free-standing membrane. In the subsequent exposure process, as illustrated in FIG. 2A, the substrate used at the time of deposition remains as a border 16 at the outer edge of the EUV transmissive membrane 10 or 110, and a reticle 18 is positioned on a border 16 opposite to the EUV transmissive membrane 10 or 110. As illustrated in FIG. 2B, the conventional EUV transmissive membrane 110 is damaged, the damaged portion of the EUV transmissive membrane 110 moves in a state of fluttering and comes into contact with the reticle 18, thereby generating particles P.

According to the EUV transmissive membrane 10, in contrast, the EUV transmissive membrane 10 can be rolled up on the first surface side (opposite to the reticle side) so that it does not come into contact with the reticle 18, as illustrated in FIG. 2C. The reason why the EUV transmissive membrane 10 of the present invention moves as described above will be described below. First, metallic beryllium having high EUV transmittance is used as a material of the EUV transmissive membrane 10 for the main layer. However, since metallic beryllium has high reactivity with a $XeF_2$ gas used for etching, a cap layer is formed on both sides (the first surface 12$a$ and the second surface 12$b$) of the main layer 12 in order to suppress the reactivity. At the time of etching, the $XeF_2$ gas reacts with the cap layer, and at least a part of the cap layer is fluorinated to form fluoride, whereby the aforementioned pair of surface layers 14 are formed on both sides of the main layer 12. Since the surface layer 14 thus contains fluoride, by controlling the stress of the pair of surface layers 14 and making a difference in stress on both sides of the EUV transmissive membrane 10, the EUV transmissive membrane can be rolled up in a case where the EUV transmissive membrane is damaged by utilizing the difference in stress. Thus, it is possible to provide the EUV transmissive membrane 10 that has high EUV transmittance but is less likely to generate particles in case the membrane is damaged by any possibility.

The main layer 12 is composed of metallic beryllium. However, the main layer 12 does not need to be completely composed of metallic beryllium. Preferably 98.0% by weight or more, more preferably 99.0% by weight or more, and even more preferably 99.5% by weight or more of the main layer 12 may be composed of metallic beryllium, whereby an EUV transmissive membrane has high EUV transmittance at a practical level can be fabricated. From this viewpoint, the thickness of the main layer 12 is preferably 10 to 70 nm, more preferably 15 to 50 nm, and even more preferably 20 to 35 nm.

The pair of surface layers 14 are designed to protect the main layer 12, a metallic beryllium layer, while preventing the EUV transmissive membrane 10 from rolling up and coming into contact with the reticle 18 to generate particles P in a case where the membrane is damaged by any possibility. Accordingly, the surface layer 14 is provided on the first surface 12$a$ and the second surface 12$b$ of the main layer 12, thereby making it possible to control stresses on both sides of the main layer 12. The surface layer 14 typically contains at least one selected from the group consisting of beryllium nitride, beryllium nitride oxide, and beryllium oxide as a main component. From the viewpoint of stress control, however, the surface layer 14 contains at least one fluoride selected from beryllium fluoride, beryllium fluoride nitride, beryllium fluoride oxide, and beryllium fluoride nitride oxide. Among them, the surface layer 14 preferably contains beryllium fluoride, beryllium fluoride nitride, beryllium fluoride oxide, or beryllium fluoride nitride oxide. Here, the "main component" in the surface layer 14 means a component that accounts for 55% by weight or more, preferably 60% by weight or more, more preferably 65% by weight or more, and even more preferably 70% by weight or more of the surface layer 14. The fluorine atom content at the outermost surface of the surface layer 14 is preferably 4 to 50 atom %, more preferably 6 to 40 atom %, and even more preferably 8 to 35 atom %.

As described above, the surface layer 14 preferably contains at least one selected from the group consisting of beryllium nitride, beryllium nitride oxide, and beryllium oxide (typically as a main component). More preferably, the surface layer 14 contains (i) beryllium fluoride and beryllium nitride, (ii) beryllium fluoride and beryllium nitride oxide, (iii) beryllium fluoride and beryllium oxide, or (iv) beryllium fluoride, beryllium oxide, and beryllium nitride. The term "beryllium nitride" as used herein means a comprehensive composition that allows not only a stoichiometric composition such as $Be_3N_2$ but also a non-stoichiometric composition such as $Be_3N_{2-x}$, wherein $0<x<2$. The same is also applicable to other compound names such as beryllium nitride oxide, beryllium oxide, beryllium fluoride nitride, beryllium fluoride oxide, and beryllium fluoride nitride oxide.

In the exposure process, from the viewpoint of stress control, it is preferable that the surface layer 14 on the first surface 12$a$ is provided on the side opposite to the reticle 18 side in the main layer 12, and the surface layer 14 on the second surface 12$b$ is provided on the reticle 18 side in the main layer 12. Consequently, in case the EUV transmissive membrane 10 is damaged by any possibility, the EUV transmissive membrane 10 can be rolled up on the first surface side (opposite to the reticle side) without coming into contact with the reticle 18, whereby the particles P are less likely to be generated, as illustrated in FIG. 2C, for example. In order to preferably realize such a state when the EUV transmissive membrane 10 is damaged, the thickness of the surface layer 14 on the first surface 12$a$ is preferably 1.1 times or more, more preferably 1.1 to 3.5 times, and even more preferably 1.2 to 3 times the thickness of the surface layer 14 on the second surface 12$b$. The fluorine atom concentration at the outermost surface of the surface layer 14 on the first surface 12$a$ side is preferably 1.5 times or more, more preferably 1.5 to 3.4 times, and even more preferably 1.7 to 3.0 times the fluorine atom concentration at the outermost surface of the surface layer 14 on the second surface 12$b$ side. Alternatively, when the thickness of the surface layer 14 on the first surface 12$a$ is greater than the thickness of the surface layer 14 on the second surface 12$b$, and the fluorine atom concentration at the outermost surface of the surface layer 14 on the first surface 12$a$ side is higher than the fluorine atom concentration at the outermost surface of the surface layer 14 on the second surface 12$b$ side, It is preferable to satisfy $A \times B \geq 2.0$, wherein A is the ratio of the thickness of the surface layer 14 at the first surface 12$a$ to the thickness of the surface layer 14 at the second surface 12$b$, and B is the ratio of the fluorine atom concentration at the outermost surface of the surface layer 14 on the first surface 12$a$ side to the fluorine atom concentration at the outermost surface of the surface layer 14 on the second surface 12$b$ side, more preferably $3.5 \geq A \times B \geq 2.0$, and even more preferably $3.0 \geq A \times B \geq 2.0$. Here, the "outermost surface" of the surface layer 14 means the surface of the surface layer 14 opposite to the surface on the main layer 12 side (first surface 12$a$ or second surface 12$b$). In this way, it is possible to control the stress more effectively on both sides of the EUV transmissive membrane and to preferably achieve the aforementioned effects by making the thickness and/or the fluorine atom concentration different between the surface layer 14 on the first surface 12*a* and the surface layer 14 on the second surface 12*b*.

The surface layer 14 on the first surface 12*a* preferably has a thickness of 0.3 to 3.0 nm, more preferably 0.5 to 2.5 nm, and even more preferably 0.8 to 2.2 nm. The surface layer 14 on second surface 12*b* is typically thinner than surface layer 14 on first surface 12*a* and preferably has a thickness of 0.2 to 2.8 nm, more preferably 0.4 to 2.3 nm, and even more preferably 0.6 to 2.0 nm.

The fluorine atom concentration at the outermost surface of the surface layer 14 on the first surface 12*a* side is preferably 4 to 50 atom %, more preferably 6 to 40 atom %, and even more preferably 8 to 35 atom %. The fluorine atom concentration at the outermost surface of the surface layer 14 on the second surface 12*b* side is preferably lower than the fluorine atom concentration at the outermost surface of the surface layer 14 on the first surface 12*a* side, and is preferably 1 to 45 atom %, more preferably 3 to 35 atom %, and even more preferably from 6 to 25 atom %.

The surface layer 14 preferably has a nitrogen concentration gradient region where nitrogen concentration decreases as the surface layer becomes closer to the main layer 12. In other words, the composition of nitride to be contained in the surface layer 14 may include form the stoichiometric composition such as $Be_3N_2$ to the non-stoichiometric composition such as $Be_3N_{2-x}$, wherein $0 < x < 2$, as described above. In a case where the nitride is contained in the surface layer 14, the nitride preferably has a gradient composition that approaches a beryllium-rich composition as the surface layer 14 becomes closer to the main layer 12. As a result, it is possible to improve the adhesion between the surface layer 14 and the main layer 12 (i.e., metallic beryllium layer) and relieve stress caused by the difference in thermal expansion between the two layers. That is, it is possible to improve the adhesion between the two layers to suppress delamination, and to make delamination difficult as a thermal expansion relaxation layer between the two layers in the case of absorbing EUV light and becoming a high temperature. The thickness of the nitrogen concentration gradient region is preferably smaller than that of the surface layer 14. In other words, the entire thickness of the surface layer 14 does not need to be in the nitrogen concentration gradient region. For example, it is preferable that only a part of the thickness of the surface layer 14, for example, a region of preferably 10 to 70% and more preferably 15 to 50% of the thickness of the surface layer 14 is the nitrogen concentration gradient region.

In the EUV transmissive membrane 10, the main region for transmitting EUV is preferably in a form of the free-standing membrane. In other words, it is preferable that the substrate (e.g., Si substrate) used at the time of deposition remains as a border only at the outer edge of the EUV transmissive membrane 10. That is, no substrate (e.g., Si substrate) remains in the main region other than the outer edge. In shoer, the main region preferably consists of the main layer 12 and the surface layer 14.

The EUV transmissive membrane 10 may have high EUV transmittance at a practical level, and preferably has an EUV transmittance of 91% or more, more preferably 92% or more, and even more preferably 93% or more. Since a higher EUV transmittance is desirable, the upper limit is not particularly limited. Although ideally 100%, the EUV transmissive membrane 10 can typically have a EUV transmittance of 99% or less, more typically 98% or less, and even more typically 95% or less.

Manufacturing Method

After a laminated membrane to be an EUV transmissive membrane is formed on a Si substrate, the EUV transmissive membrane according to the present invention can be fabricated by removing an unnecessary portion of the Si substrate through etching with $XeF_2$ to form a free-standing membrane while fluorinating the membrane. Accordingly, the main portion of the EUV transmissive membrane is in the form of the free-standing membrane in which no Si substrate remains as described above.

(1) Preparation of Si Substrate

First, a Si substrate for forming a laminated membrane thereon is prepared. After the laminated membrane composed of the main layer 12 and the surface layer 14 is formed on the Si substrate, the main region (i.e., a region to be a free-standing membrane) other than the outer edge of the Si substrate is removed by etching with $XeF_2$. Accordingly, it is desirable to reduce the thickness of the Si substrate in the region to be formed into the free-standing membrane in advance in order to perform the etching efficiently in a short time. Therefore, it is desirable that a mask corresponding to the EUV transmission shape is formed on the Si substrate by employing a normal semiconductor process, and the Si substrate is etched by wet etching to reduce the thickness of the main region of the Si substrate to a predetermined thickness. The wet-etched Si substrate is cleaned and dried to prepare a Si substrate having a cavity formed by wet etching. The wet etching mask may be made of any material that is corrosion resistance to Si wet etchant, for example, $SiO_2$ is suitable for use. In addition, the wet etchant is not particularly limited as long as it is capable of etching Si. For example, TMAH (tetramethylammonium hydroxide) is preferred because it can be used under appropriate conditions, and very good anisotropic etching can be performed on Si.

(2) Formation of Laminated Membrane

The laminated membrane may be formed by any deposition method. An example of the preferred deposition method is a sputtering method. In the case of fabricating a laminated membrane with a three-layer structure of beryllium nitride/beryllium/beryllium nitride, it is preferable that the beryllium membrane as the main layer 12 is fabricated by sputtering using a pure Be target and the beryllium nitride membrane as the surface layer 14 is fabricated by reactive sputtering. The reactive sputtering can be performed, for example, by adding nitrogen gas to the chamber during sputtering using a pure Be target, whereby beryllium and nitrogen react to each other to generate beryllium nitride. As another method, beryllium nitride can be produced by forming a beryllium membrane and then irradiating the membrane with nitrogen plasma to cause a nitriding reaction of beryllium, thereby generating beryllium nitride. In any case, synthetic methods for beryllium nitride are not limited thereto. Although it is preferable to use different beryllium targets for forming the beryllium nitride membrane and the beryllium membrane, it is also possible to use the same target for forming the beryllium nitride membrane and the beryllium membrane. The beryllium nitride and beryllium membranes may be formed in a one-chamber sputtering apparatus as in Examples described later, or a two-chamber sputtering apparatus may be used to form the beryllium nitride and beryllium membranes in separate chambers.

In the case of forming a nitrogen concentration gradient region, when depositing metallic beryllium from the beryllium nitride membrane, the introduction of nitrogen gas may be stopped and switched to metallic beryllium deposition while continuing a sputtering. In this way, a region is formed in which the nitrogen concentration in the film-deposited membrane decreases in the thickness direction as the concentration of nitrogen gas decreases. On the other hand, in the case of switching the metallic beryllium to the beryllium nitride, the nitrogen concentration gradient region can be formed by starting the introduction of nitrogen gas in the middle of the process while sputtering is performed, contrary to the above. The thickness of the nitrogen concentration gradient region can be controlled by adjusting the time for which the nitrogen gas concentration is changed.

(3) Free-Standing Membrane Formation and Fluorination

An unnecessary portion of the Si substrate other than the outer edge of the Si substrate where the composite membrane is formed, which is left as a border, is removed by etching with $XeF_2$ to make the composite membrane free-standing. In this etching step, when the etching of Si in the cavity portion progresses and Si disappears, the back side of the composite membrane (the surface on the cavity side which has been in contact with the Si substrate) is exposed and a fluorination reaction occurs, thereby forming a surface layer on the second surface of the main layer. On the other hand, the front side of the composite membrane (the side opposite to the Si substrate that is exposed from the beginning) also undergoes a fluorination reaction, thereby forming the surface layer on the first surface of the main layer. However, since the front side is exposed from the beginning, the fluorination reaction occurs from the beginning of the etching step. In other words, since the exposure time to $XeF_2$ differs between the front and back sides of the composite membrane, the front side has longer contact time with $XeF_2$ and more fluoride. Accordingly, the fluorine atom concentration of the surface layer on the first surface side is higher than the fluorine atom concentration of the surface layer on the second surface side. Although the type of fluoride varies depending on the material of the beryllium layer that reacts with $XeF_2$, reaction temperature, reaction time, and other factors, it has been confirmed that in a case where beryllium nitride is formed at the outermost layer of the composite membrane, beryllium fluoride, beryllium fluoride oxide, beryllium fluoride nitride, and beryllium fluoride nitride oxide are produced.

EXAMPLES

The present invention will be described in more detail with reference to the following examples.

Example 1

In order to confirm how the stress of a beryllium composite membrane (a laminated membrane with a three-layer structure of beryllium nitride/beryllium/beryllium nitride) changes when fluorinated, a composite membrane was formed on a Si substrate, and the stress change in the composite membrane before and after fluorination was examined. First, a $SiO_2$ membrane was formed on one side of the Si substrate by thermal oxidation to prevent the one side from being etched by $XeF_2$ used for fluorination of the composite membrane. A beryllium composite membrane was formed on the surface of the Si substrate opposite to the surface on which the $SiO_2$ membrane was formed. Specifically, the Si substrate with the $SiO_2$ membrane formed was first set in a sputtering apparatus, and a pure Be target was attached thereto. A chamber was evacuated, the flow ratio of argon gas and nitrogen gas was adjusted to 1:1 to carry out reactive sputtering at an internal pressure of 0.5 Pa, and the reactive sputtering was terminated at the time when 2 nm of beryllium nitride was layer-deposited. Subsequently, sputtering was performed only with argon gas without introducing nitrogen gas, and the sputtering was terminated at the time when 25 nm of beryllium was layer-deposited. Thereafter, reactive sputtering was performed while introducing nitrogen gas again in the same manner as in the first step, and the reactive sputtering was terminated at the time when 2 nm of beryllium nitride was layer-deposited. In this manner, a beryllium composite membrane with 2 nm of beryllium nitride ($Be_3N_2$)/25 nm of metallic beryllium (Be)/2 nm of beryllium nitride ($Be_3N_2$) was formed. When a warp amount of the Si substrate was measured before and after the formation of the composite membrane, the warp amount of the Si substrate after the formation of the composite membrane was larger than that of the Si substrate before the formation of the composite membrane, thus confirming that tensile stress was present on the composite membrane. Subsequently, the Si substrate was exposed to $XeF_2$ gas to fluorinate beryllium nitride in the composite membrane. When a warp amount of the Si substrate was measured before and after fluorination, the warp amount of the Si substrate after fluorination was larger than that of the Si substrate before fluorination, thus confirming that tensile stress of the composite membrane was increased after fluorination. The results indicate that stress is inherent in the beryllium composite membrane and that the stress can be controlled by fluorination. Accordingly, fluorination can make a difference in stress on both sides of the EUV transmissive membrane (e.g., beryllium composite membrane), and the difference in stress can be used to allow the EUV transmissive membrane to roll up when the EUV transmissive membrane is damaged.

Example 2

According to the procedures illustrated in FIGS. 3A and 3B, a composite free-standing membrane (EUV transmissive membrane) with a three-layer structure of surface layer/main layer/surface layer was fabricated as follows.

(1) Preparation of Si Substrate

Figure 3B:
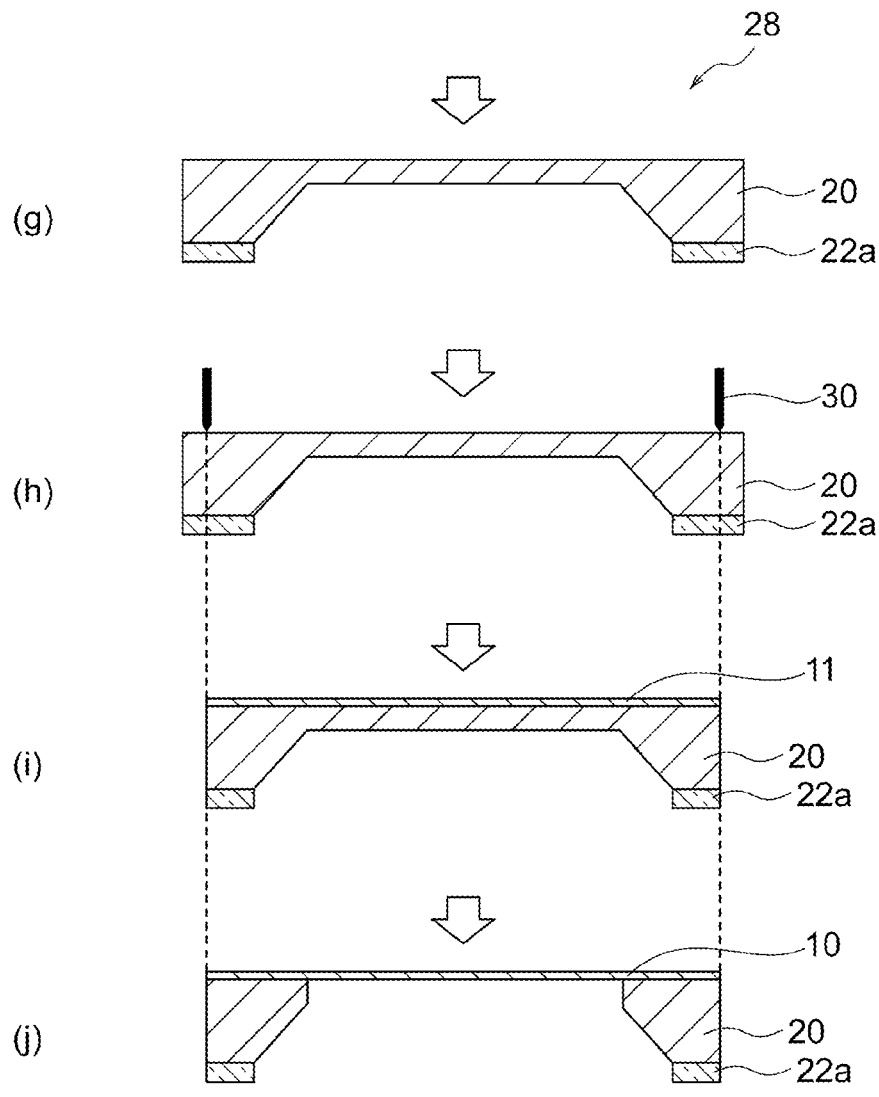
FIG. 3B is a process flow diagram illustrating the second half of a manufacturing procedure for an EUV transmissive membrane in Example 2.

A Si wafer 20 having a diameter of 8 inches (20.32 cm) was prepared (FIG. 3A(a)). A $SiO_2$ membrane 22 having a thickness of 50 nm was formed on both sides of the Si wafer 20 by thermal oxidation (FIG. 3A(b)). Resist was applied to both sides of the Si wafer 20, and a resist mask 24 for $SiO_2$ etching was formed by exposure and development so that a 110 mm×145 mm resist hole was created on one side (FIG. 3A(c)). An exposed portion of the $SiO_2$ membrane 22 was etched and removed by wet-etching one side of the substrate with hydrofluoric acid to fabricate a $SiO_2$ mask 22a (FIG. 3A(d)). The resist mask 24 for $SiO_2$ etching was removed with an ashing apparatus (FIG. 3A(e)). Si was then etched with a TMAH solution. This etching was performed only for an etching time to obtain a target Si substrate having a thickness of 50 μm with an etching rate measured in advance (FIG. 3A(f)). Finally, the $SiO_2$ membrane 22 formed on the surface not subjected to Si etching was removed and cleaned with hydrofluoric acid to prepare a Si substrate 28 (FIG. 3B(g)). The Si substrate outline may be diced with a laser 30, if necessary (FIG. 3B(h)), to achieve the desired shape (FIG. 3B (i)). In this way, a 110 mm×145 mm cavity 26 was provided at the center of the 8-inch (20.32 cm) Si wafer 20 to prepare the Si substrate 28 having a Si thickness of 50 μm in the cavity 26 portion.

(2) Formation of Composite Membrane

On the Si substrate 28 including the cavity 26 obtained in (1) above, a composite membrane with a three-layer structure of beryllium nitride/beryllium/beryllium nitride was formed as follows (FIG. 3B(i)). First, the Si substrate 28 was set in a sputtering apparatus, and a pure Be target was attached thereto. A chamber was evacuated, the flow ratio of argon gas and nitrogen gas was adjusted to 1:1 to carry out reactive sputtering at an internal pressure of 0.5 Pa, and the reactive sputtering was terminated at the time when 2 nm of beryllium nitride was layer-deposited. Subsequently, sputtering was performed only with argon gas without introducing nitrogen gas, and the sputtering was terminated at the time when 25 nm of beryllium was layer-deposited. Thereafter, reactive sputtering was performed while introducing nitrogen gas again in the same manner as in the first step, and the reactive sputtering was terminated at the time when 2 nm of beryllium nitride was layer-deposited. In this manner, a composite membrane 11 with 2 nm of beryllium nitride $(Be_3N_2)/25$ nm of metallic beryllium (Be)/2 nm of beryllium nitride $(Be_3N_2)$ was formed.

(3) Free-Standing Membrane Formation and Fluorination

The Si substrate 28 with the composite membrane 11 prepared in (2) above was set in a chamber of an $XeF_2$ etcher capable of processing an 8-inch (20.32 cm) substrate. The chamber was sufficiently evacuated. At this time, if moisture remains in the chamber, the moisture reacts with the $XeF_2$ gas to generate hydrofluoric acid, and corrosion of the etcher or unexpected etching occurs. Therefore, the sufficient evacuation was performed. If necessary, vacuuming and nitrogen gas introduction were repeated in the chamber to reduce residual moisture in the chamber. When the sufficient evacuation was achieved, a valve between a $XeF_2$ material tank and a preliminary space was opened. As a result, $XeF_2$ was sublimated, and $XeF_2$ gas was also accumulated in the preliminary space. When the $XeF_2$ gas was sufficiently accumulated in the preliminary space, the valve between the preliminary space and the chamber was opened to introduce the $XeF_2$ gas into the chamber. The $XeF_2$ gas was decomposed into Xe and F, and F reacted with Si to generate $SiF_4$. Since the boiling point of $SiF_4$ was $-95°$ C., $SiF_4$ generated was rapidly evaporated, causing a reaction of F with the newly exposed Si substrate. When the Si etching proceeded and F in the chamber decreased, the chamber was evacuated, and the $XeF_2$ gas was introduced into the chamber again to perform the etching. In this manner, the evacuation, the introduction of the $XeF_2$ gas, and the etching were repeated, and the etching was continued until the Si wafer 20 corresponding to the portion to be formed into the free-standing membrane disappeared. When the Si substrate of the unnecessary portion disappeared, the etching was terminated. In this way, a composite free-standing membrane having a border made of Si is obtained as the EUV transmissive membrane 10 (FIG. 3B(j)). In the etching, F also reacts with a beryllium layer of the first surface (the surface opposite to the Si wafer 20) and a beryllium nitride layer of the second surface (the surface on the Si wafer 20 side) in the composite membrane 11. Thus, a pair of surface layers in the EUV transmissive membrane 10 thus obtained contains fluoride.

(4) TEM/EDS of Cross Section of EUV Transmissive Membrane

Samples of EUV transmissive membrane cut into cross sections by focused ion beam (FIB) processing were observed with a transmission electron microscope (TEM) (JEM-2100F, manufactured by JEOL Ltd.) at 200 kV and elements were analyzed with an EDS analyzer (JED-2300T, manufactured by JEOL Ltd.) at an acceleration voltage of 5 keV for elemental mapping and point analysis mode. As a result, it was found that the main layer had a thickness of 24 nm, the surface layer at the first surface had a thickness of 2.3 nm, and the surface layer at the second surface had a thickness of 1.9 nm. Since a small amount of fluorine was detected only at the outermost surface of the surface layer on the second surface, it was concluded that beryllium fluoride nitride was produced at the outermost surface of the surface layer on the second surface. On the other hand, fluorine was detected deeper in the surface layer on the first surface than in the surface layer on the second surface, thus indicating that more beryllium fluoride nitride was produced in the surface layer on the first surface. In addition, nitrogen and a small amount of oxygen were also detected from a portion where fluorine was detected in the surface layers on the first and second surfaces. From the above, it was found that the surface layer on the first surface of the EUV transmissive membrane had a higher fluorine atom concentration than the surface layer on the second surface, and that the fluoride generated on the surface layers (first and second surfaces) contained beryllium fluoride nitride as the main component and a small amount of beryllium fluoride nitride oxide and/or beryllium fluoride oxide.

In the evaluation in (4) above, the fluorine atom concentration at the outermost surface of the surface layer on the first surface side was 32 atom % and at the outermost surface of the surface layer on the second surface side was 18 atom %. Therefore, A, the ratio of the thickness of the surface layer on the first surface to the thickness of the surface layer on the second surface, is 1.21, and B, the ratio of the fluorine atom concentration at the outermost surface of the surface layer on the first surface side to the fluorine atom concentration at the outermost surface of the surface layer 14 on the second surface side, is 1.78. It was thus found that $A×B=2.15$.

(5) Observation of State of EUV Transmissive Membrane after Breakage

When the center of the EUV transmissive membrane was pierced with a needle, the torn free-standing membrane rolled up on the first surface side, and no particle generation was observed. In other words, the state of the EUV transmissive membrane after breakage was as illustrated in FIG. 2C.

Since the EUV transmissive membrane according to the present invention has different stresses between the first surface and the second surface in the surface layer, in case the EUV transmissive membrane is damaged by any possibility, the damaged EUV transmissive membrane rolls up on the first surface side (opposite to the reticle side), thereby preventing the EUV transmissive membrane from moving around and coming into contact with the reticle and border to generate particles.

What is claimed is:

1. An EUV transmissive membrane comprising:

a main layer composed of metallic beryllium that has a first surface on one side of the main layer and a second surface on an opposite side of the main layer; and a first surface layer provided on the first surface of the main layer and a second surface layer provided on the second surface of the main layer, wherein each of the first surface layer and the second surface layer comprise at least one fluoride selected from beryllium fluoride, beryllium fluoride nitride, beryllium fluoride oxide, and beryllium fluoride nitride oxide.

2. The EUV transmissive membrane according to claim 1, wherein each of the first surface layer and the second surface layer comprises beryllium fluoride.

3. The EUV transmissive membrane according to claim 1, wherein each of the first surface layer and the second surface layer comprises beryllium fluoride nitride.

4. The EUV transmissive membrane according to claim 1, wherein each of the first surface layer and the second surface layer comprises beryllium fluoride oxide.

5. The EUV transmissive membrane according to claim 1, wherein each of the first surface layer and the second surface layer comprises beryllium fluoride nitride oxide.

6. The EUV transmissive membrane according to claim 1, wherein each of the first surface layer and the second surface layer further comprises at least one selected from the group consisting of beryllium nitride, beryllium nitride oxide, and beryllium oxide.

7. The EUV transmissive membrane according to claim 6, wherein each of the first surface layer and the second surface layer comprises beryllium fluoride and beryllium nitride.

8. The EUV transmissive membrane according to claim 6, wherein each of the first surface layer and the second surface layer comprises beryllium fluoride and beryllium nitride oxide.

9. The EUV transmissive membrane according to claim 6, wherein each of the first surface layer and the second surface layer comprises beryllium fluoride and beryllium oxide.

10. The EUV transmissive membrane according to claim 6, wherein each of the first surface layer and the second surface layer comprises beryllium fluoride, beryllium oxide, and beryllium nitride.

11. The EUV transmissive membrane according to claim 1, wherein a thickness of the first surface layer is 1.1 times or more of a thickness of the second surface layer.

12. The EUV transmissive membrane according to claim 1, wherein a fluorine atom concentration at an outermost surface of the first surface layer is 1.5 times or more of a fluorine atom concentration at an outermost surface of the second surface layer.

13. The EUV transmissive membrane according to claim 1, wherein a thickness of the first surface layer is greater than a thickness of the second surface layer, and a fluorine atom concentration at an outermost surface of the first surface layer is higher than a fluorine atom concentration at an outermost surface of the second surface layer, wherein a ratio of the thickness of the first surface layer to the thickness of the second surface layer, denoted by A, and a ratio of the fluorine atom concentration at the outermost surface of the first surface layer to the fluorine atom concentration at the outermost surface of the second surface layer, denoted by B, satisfy $A \times B \geq 2.0$.

* * * * *